US012225783B2

(12) United States Patent
Sun

(10) Patent No.: US 12,225,783 B2
(45) Date of Patent: Feb. 11, 2025

(54) HIGH SCREEN RATIO ORGANIC LIGHT EMITTING DIODE DISPLAY PANEL

(71) Applicant: Wuhan China Star Optoetronics Semiconductor Display Technology Co., Ltd., Hubei (CN)

(72) Inventor: Yexi Sun, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 772 days.

(21) Appl. No.: 16/603,436

(22) PCT Filed: Jul. 18, 2019

(86) PCT No.: PCT/CN2019/096461
§ 371 (c)(1),
(2) Date: Oct. 12, 2021

(87) PCT Pub. No.: WO2020/125004
PCT Pub. Date: Jun. 25, 2020

(65) Prior Publication Data
US 2022/0037444 A1 Feb. 3, 2022

(30) Foreign Application Priority Data

Dec. 18, 2018 (CN) .......................... 201811554942.9

(51) Int. Cl.
*H10K 59/131* (2023.01)
*H10K 50/844* (2023.01)
(52) U.S. Cl.
CPC ......... *H10K 59/131* (2023.02); *H10K 50/844* (2023.02)

(58) Field of Classification Search
CPC .. H10K 59/131; H10K 59/873; H10K 59/124; H10K 50/844; G09G 3/3208; G09G 3/04
See application file for complete search history.

(56) References Cited

U.S. PATENT DOCUMENTS 5,920,084 A * 7/1999 Gu .................... G02F 1/136286
257/E21.414
10,937,993 B2 * 3/2021 Tang .................... H10K 50/828
(Continued)

FOREIGN PATENT DOCUMENTS

CN          106229297 A     12/2016
CN          107783698 A     3/2018
(Continued)

OTHER PUBLICATIONS

CN108732841A (Xiamen Tianma Microelectronics Co. Ltd.,) Nov. 2, 2018, retrieved from Espacenet (translation) (https://worldwide.espacenet.com/) (Year: 2018).*

*Primary Examiner* — Herve-Louis Y Assouman
*Assistant Examiner* — Linda J. Fleck
(74) *Attorney, Agent, or Firm* — Taft Stettinius & Hollister LLP

(57) ABSTRACT

An organic light-emitting diode display panel includes a display area, a transparent area, and a wire exchange area. The display area is used for displaying an image; the transparent area is used for placing a device, and the wire exchange area is positioned at a wire connecting site between the display area and the transparent area, wherein a metal wire from the display area is electrically connected to a high light-transmissive metal wire through a via-hole at the wire exchange area, and the high light-transmissive metal wire extends to the transparent area.

15 Claims, 3 Drawing Sheets

(56) References Cited

U.S. PATENT DOCUMENTS

| | | | |
|---|---|---|---|
| 11,108,019 B2* | 8/2021 | Jin | ........................ H10K 59/131 |
| 2007/0216290 A1 | 9/2007 | Kawachi et al. | |
| 2008/0111484 A1* | 5/2008 | Kwon | ................... H10K 59/123 |
| | | | 313/506 |
| 2015/0295014 A1* | 10/2015 | Lee | ...................... H10K 59/122 |
| | | | 257/40 |
| 2016/0211273 A1* | 7/2016 | Moon | .................... H01L 27/124 |
| 2017/0179433 A1* | 6/2017 | Nam | ....................... H10K 71/00 |
| 2018/0219184 A1 | 8/2018 | Chi et al. | |
| 2019/0123121 A1* | 4/2019 | Liu | ..................... H10K 59/1213 |
| 2020/0258967 A1* | 8/2020 | Kim | ................... H01L 27/1218 |
| 2020/0287161 A1* | 9/2020 | Kim | ..................... H10K 50/868 |
| 2020/0411625 A1* | 12/2020 | Seo | ...................... G02F 1/13452 |
| 2022/0384540 A1* | 12/2022 | Qin | ........................ H10K 71/00 |

FOREIGN PATENT DOCUMENTS

| | | |
|---|---|---|
| CN | 108091679 A | 5/2018 |
| CN | 108389879 A | 8/2018 |
| CN | 108520888 A | 9/2018 |
| CN | 108598115 A | 9/2018 |
| CN | 108732841 A | 11/2018 |
| CN | 108919581 A | 11/2018 |
| CN | 108986678 A | 12/2018 |
| CN | 109686762 A | 4/2019 |

\* cited by examiner

HIGH SCREEN RATIO ORGANIC LIGHT EMITTING DIODE DISPLAY PANEL

CROSS-REFERENCE TO RELATED APPLICATIONS

This application is a U.S. National Phase of International PCT Application No. PCT/CN2019/096461 filed Jul. 18, 2019, which claims the benefit of Chinese Patent Application Serial No. 201811554942.9 filed Dec. 18, 2018, the contents of each application are incorporated herein by reference in their entirety.

FIELD OF INVENTION

The present invention relates to the field of display technology, and in particular, to an organic light-emitting diode (OLED) display panel.

BACKGROUND OF INVENTION

Organic light-emitting diode (OLED) display devices have many advantages such as a wide viewing angles, fast response times, thin thickness, and low power consumption, such that the organic light-emitting display devices are widely applied to various electronic devices.

Recently, "full screen" displays that have a high-screen ratio and ultra-narrow borders have become popular in the field of OLED display. The advantage of "full screen" is that it can maximize utilization of the screen's display area, giving users a better visual experience.

Technical Problem

Placement of a front camera, ambient light sensor, earpiece and other light-sensing devices on the front side of the mobile phone is an important issue in mobile phone with "full screen" design. Utilization of profiled cutting is the most common method for the "full screen" design mobile phone in industry, but cutting process of the method is complex and its package reliability is poor. Therefore, it is urgent to propose a high screen ratio of OLED display design that avoids profiled cutting.

SUMMARY OF INVENTION

In order to solve the above problem, the present invention provides an organic light-emitting diode (OLED) display panel, including: a display area for displaying images; a transparent area for placing a device; and a wire exchange area, positioned at a wire connecting site between the display area and the transparent area; wherein a metal wire from the display area is electrically connected to a high light-transmissive metal wire through a via-hole at the wire exchange area, and the high light-transmissive metal wire extends to the transparent area.

Preferably, the high light-transmissive metal wire is composed of at least one of indium gallium zinc oxide (InGaZnO), indium gallium oxide (InGaO), indium tin zinc oxide (ITZO), and aluminum zinc oxide (AlZnO).

Preferably, a film layer structure of the display area includes a substrate, an inorganic buffer layer, an active semiconductor layer, an inorganic insulating layer, a first-metal wire, a second-metal wire, a third-metal wire, an organic planarization layer, an anode layer, an organic opening layer, a luminescent material layer, a cathode layer, and an encapsulation layer.

Preferably, a film layer structure of the wire exchange area includes a substrate, an inorganic buffer layer, an active semiconductor layer, an inorganic insulating layer, a first-metal wire, a first-high light-transmissive metal wire, a second-high light-transmissive metal wire, a third-metal wire, an organic planarization layer, an organic opening layer, a cathode layer, and an encapsulation layer.

Preferably, a film layer structure of the transparent area includes a substrate, an inorganic buffer layer, an active semiconductor layer, an inorganic insulating layer, a first-high light-transmissive metal wire, a second-high light-transmissive metal wire, an organic planarization layer, an organic opening layer, a cathode layer, and an encapsulation layer.

Preferably, the anode layer and the first-metal wire are electrically connected through the via-hole.

Preferably, the first-metal wire and the active semiconductor layer are electrically connected through the via-hole.

Preferably, the first-high light-transmissive metal wire and the second-high light-transmissive metal wire is electrically connected to the third-metal wire and the first-metal wire through via-holes, respectively.

Preferably, the substrate is composed of polyimide.

Preferably, each of the organic planarization layer and the organic opening layer is composed of a transparent organic material.

The present invention provides another organic light-emitting diode display panel including: a display area for displaying images, a film layer structure of the display area includes a substrate, an inorganic buffer layer, an active semiconductor layer, an inorganic insulating layer, a first-metal wire, a second-metal wire, a third-metal wire, an organic planarization layer, an anode layer, an organic opening layer, a luminescent material layer, a cathode layer, and an encapsulation layer; a transparent area for placing a device, a film layer structure of the transparent area includes a substrate, an inorganic buffer layer, an active semiconductor layer, an inorganic insulating layer, a first-high light-transmissive metal wire, a second-high light-transmissive metal wire, an organic planarization layer, an organic opening layer, a cathode layer, and an encapsulation layer; and a wire exchange area, positioned at a wire connecting site between the display area and the transparent area, a film layer structure of the wire exchange area includes a substrate, an inorganic buffer layer, an active semiconductor layer, an inorganic insulating layer, a first-metal wire, a first-high light-transmissive metal wire, a second-high light-transmissive metal wire, a third-metal wire, an organic planarization layer, an organic opening layer, a cathode layer, and an encapsulation layer; wherein a metal wire from the display area is electrically connected to a high light-transmissive metal wire through a via-hole at the wire exchange area, and the high light-transmissive metal wire extends to the transparent area.

Preferably, the high light-transmissive metal wire is composed of at least one of indium gallium zinc oxide (InGaZnO), indium gallium oxide (InGaO), indium tin zinc oxide (ITZO), and aluminum zinc oxide (AlZnO).

Preferably, the anode layer and the first-metal wire are electrically connected through the via-hole at the display area.

Preferably, the first-metal wire and the active semiconductor layer are electrically connected through the via-hole at the display area.

Preferably, the first-high light-transmissive metal wire and the second-high light-transmissive metal wire is electrically connected to the third-metal wire and the first-metal wire through via-holes, respectively at the wire exchange area.

Preferably, the substrate is composed of polyimide.

Preferably, each of the organic planarization layer and the organic opening layer is composed of a transparent organic material.

The present invention further provides another organic light-emitting diode display panel including: a display area for displaying images; a transparent area for placing a device; and a wire exchange area, positioned at a wire connecting site between the display area and the transparent area; wherein a metal wire from the display area is electrically connected to a high light-transmissive metal wire through a via-hole at the wire exchange area, and the high light-transmissive metal wire extends to the transparent area; wherein the high light-transmissive metal wire is composed of at least one of indium gallium zinc oxide (InGaZnO), indium gallium oxide (InGaO), indium tin zinc oxide (ITZO), and aluminum zinc oxide (AlZnO); and wherein a film layer structure of the display area includes a substrate, an inorganic buffer layer, an active semiconductor layer, an inorganic insulating layer, a first-metal wire, a second-metal wire, a third-metal wire, an organic planarization layer, an anode layer, an organic opening layer, a luminescent material layer, a cathode layer, and an encapsulation layer.

Beneficial Effect

The solution adopted by the invention avoids complicated wirings winding, improves the transparency of the transparent area, and improves the uniformity of the peripheral area of a display panel. In addition, a profiled cutting process is avoided, the screen ratio and reliability are improved, the process flow is reduced, and the production cost is significantly saved.

DESCRIPTION OF DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

DETAILED DESCRIPTION OF PREFERRED EMBODIMENTS

The technical solutions in the embodiments of the present invention will be clearly and completely described as follows with reference to the drawings in the embodiments of the present invention. Obviously, the described embodiments are a part of the embodiments in the invention, not all of them. Based on the embodiments of the present invention, all other embodiments obtained by those skilled in the field without doing any creative activity are within the claimed scope of the present invention.

Figure 1:
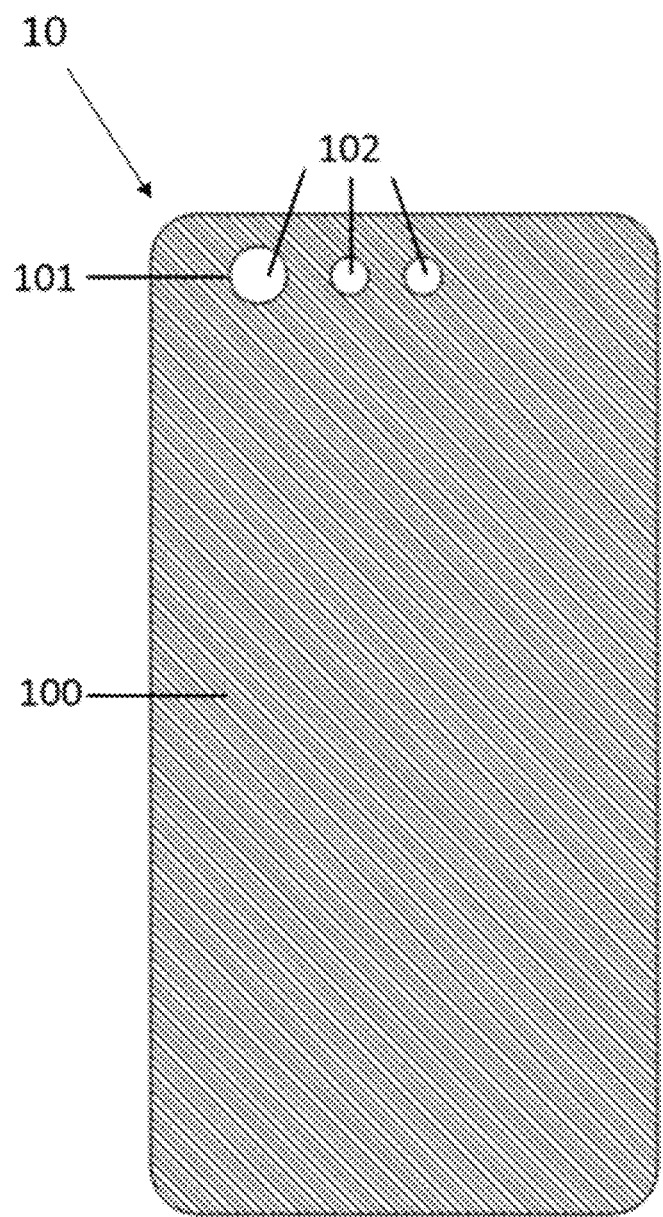
FIG. 1 is a schematic view showing a configuration of a display panel according to a preferred embodiment of the present invention.

FIG. 1 is a schematic view showing an arrangement of an organic light-emitting diode (OLED) display panel 10 according to a preferred embodiment of the present invention. The OLED display panel 10 includes a display area 100 for displaying images; a transparent area 102 for placing a device; and a wire exchange area 101, positioned at a wire connecting site between the display area 100 and the transparent area 102; wherein a metal wire from the display area 100 is electrically connected to a high light-transmissive metal wire through a via-hole at the wire exchange area 101, and the high light-transmissive metal wire extends to the transparent area 102.

The high light-transmissive metal wire is composed of a metal material having high transparency or a material having a thinner thickness. The transparent area 102 is shaped to match a shape and size of a device to be placed. The device is specifically, for example, a mobile phone front camera, a distance sensor, a photosensitive element, and the like.

Figure 2:
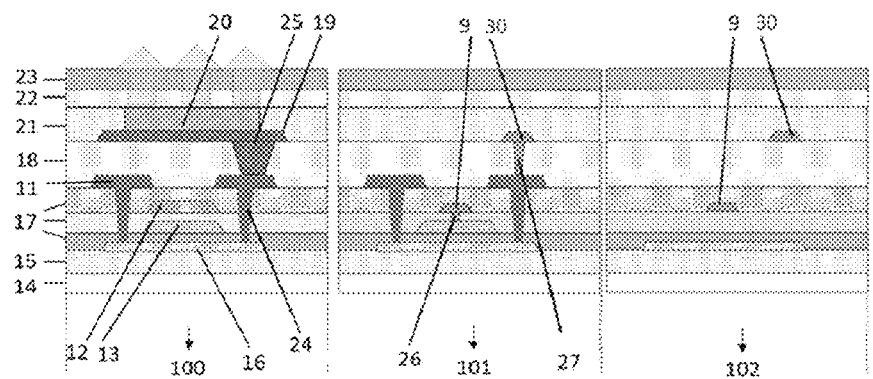
FIG. 2 is a cross-sectional view of a display panel in accordance with a preferred embodiment of the present invention.

FIG. 2 is a cross-sectional view of a display panel in accordance with a preferred embodiment of the present invention, includes a film structure of the display area 100, a wire exchange area 101, and a transparent area 102.

A film layer structure of the display area 100 includes a substrate 14, an inorganic buffer layer 15, an active semiconductor layer 16, an inorganic insulating layer 17, a first-metal wire 11, a second-metal wire 12, a third-metal wire 13, an organic planarization layer 18, an anode layer 19, an organic opening layer 21, a luminescent material layer 20, a cathode layer 22, and an encapsulation layer 23, disposed on the substrate 14.

The substrate 14 is preferably composed of a flexible transparent material such as polyimide. The inorganic buffer layer 15 and the inorganic insulating layer 17 are preferably composed of silicon nitride or silicon oxide. The active semiconductor layer 16 is preferably composed of low-temperature polysilicon. The first-metal wire 11 is preferably composed of titanium (Ti) or aluminum (Al). The second-metal wire 12 and the third-metal wire 13 are preferably composed of molybdenum (Mo). The cathode layer 22 is preferably composed of magnesium (Mg) silver (Ag) alloy material. The organic planarization layer 18 and the organic opening layer 21 are preferably composed of a transparent organic material.

A film layer structure of the wire exchange area 101 includes a substrate 14, an inorganic buffer layer 15, an active semiconductor layer 16, an inorganic insulating layer 17, a third-metal wire 13, a first-high light-transmissive metal wire 9, a first-metal wire 11, an organic planarization layer 18, a second-high light-transmissive metal wire 30, an organic opening layer 21, a cathode layer 22, and an encapsulation layer 23, disposed on the substrate 14

Compared to the film structure of the display area 100, the film layer structure of the wire exchange area 101 reduces the luminescent material layer 20 and the anode layer 19, and shares the substrate 14, the inorganic buffer layer 15, the active semiconductor layer 16, the inorganic insulating layer 17, the organic planarization layer 18, the organic opening layer 21, the cathode 22, and the encapsulating layer 23 with the display area 100. The first-high light-transmissive metal wire 9 and the second-high light-transmissive metal wire 30 are preferably composed of a metal material having high transparency or a material with a thinner thickness, such as indium gallium zinc oxide (InGaZnO), indium gallium oxide (InGaO), indium tin zinc oxide (ITZO) and aluminum zinc oxide (AlZnO) and the like.

A film layer structure of the transparent area 102 includes a substrate 14, an inorganic buffer layer 15, an active semiconductor layer 16, an inorganic insulating layer 17, an organic planarization layer 18, an organic opening layer 21, a cathode layer 22, and an encapsulation layer 23, disposed on the substrate 14.

The transparent area 102 shares a film structure of the substrate 14, the inorganic buffer layer 15, the active semiconductor layer 16, the inorganic insulating layer 17, the organic planarization layer 18, the organic opening layer 21, the cathode 22, and the encapsulation layer 23 with the display area 100.

Figure 4:
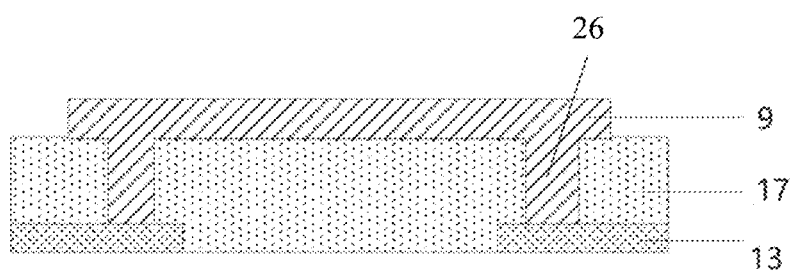
FIG. 4 is a schematic cross-sectional view of a part of a wire exchange area according to some embodiments of the present application.
Figure 5:
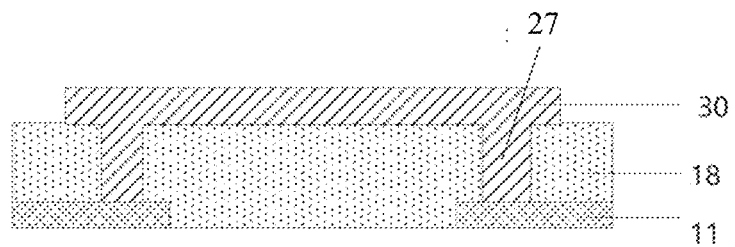
FIG. 5 is a schematic cross-sectional view of a part of a wire exchange area according to some embodiments of the present application.

The anode layer 19 is electrically connected to the first-metal wire 11 through a via-hole 25; the first-metal wire 11 is electrically connected to the active semiconductor layer 16 through a via-hole 24; the first-high light-transmissive metal wire 9 and the second-high light-transmissive metal wire 10 is electrically connected to the third-metal wire 13 and the first-metal wire 11 through via-holes 26 and 27, respectively, as show in FIGS. 4 and 5.

The film structure shared by the display area 100, the wire exchange area 101, and the transparent area 102 is formed in the same process.

Figure 3:
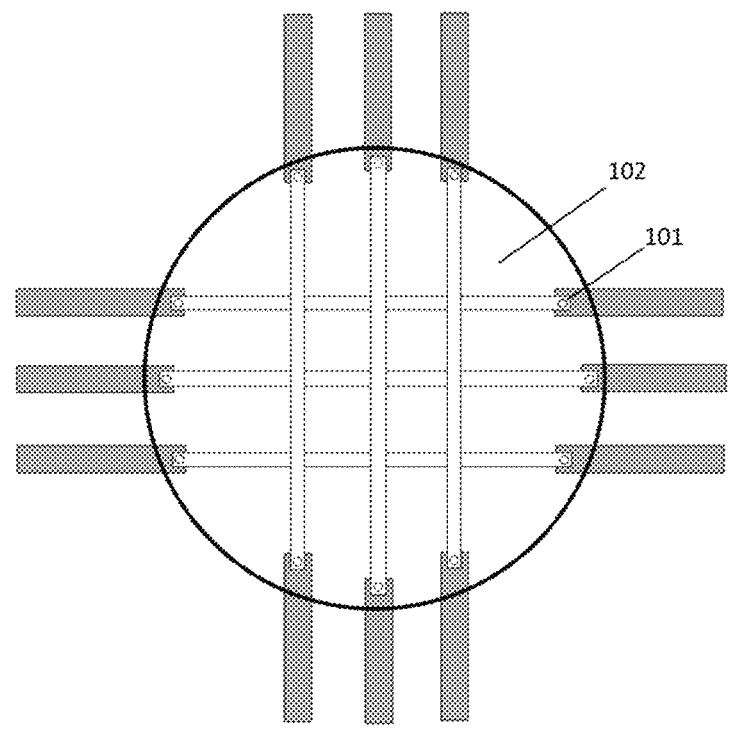
FIG. 3 is an enlarged schematic view of a wire exchange area near a transparent area shown in FIG. 1.

FIG. 3 is an enlarged schematic view of a wire exchange area 101 near the transparent area 102 shown in FIG. 1 At a position of the wire exchange area 101 at the boundary between the display area 100 and the transparent area 102, a metal wire originating from the display area 100 is electrically connected to a high light-transmissive metal wire through a via-hole, and the high light-transmissive metal wire extends to the transparent region 102. The high light-transmitting metal wire is preferably composed of at least one of indium gallium zinc oxide (InGaZnO), indium gallium oxide (InGaO), indium tin zinc oxide (ITZO), and aluminum zinc oxide (AlZnO).

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

What is claimed is:

1. An organic light-emitting diode display panel comprising:
   a display area for displaying images;
   a transparent area for placing a device; and
   a wire exchange area, positioned at a wire connecting site between the display area and the transparent area;
   wherein the wire exchange area comprises a substrate, an inorganic buffer layer, an active semiconductor layer, a third-metal wire, an inorganic insulating layer, a first-high light-transmissive metal wire, a first-metal wire, an organic planarization layer, a second-high light-transmissive metal wire, an organic opening layer, a cathode layer, and an encapsulation layer which are stacked in sequence,
   the first metal wire is electrically connected to the second-high light-transmissive metal wire through a first via hole, the third metal wire is electrically connected to the first-high light-transmissive metal wire through a second via hole, and the first-high light-transmissive metal wire and the second-high light-transmissive metal wire extend to the transparent area.

2. The organic light-emitting diode display panel according to claim 1, wherein the first high light-transmissive metal wire and the second-high light-transmissive metal wire are each composed of at least one of indium gallium zinc oxide (InGaZnO), indium gallium oxide (InGaO), indium tin zinc oxide (ITZO), and aluminum zinc oxide (AlZnO).

3. The organic light-emitting diode display panel according to claim 1, wherein a film layer structure of the display area comprises the substrate, the inorganic buffer layer, the active semiconductor layer, the inorganic insulating layer, the first-metal wire, a second-metal wire, the third-metal wire, the organic planarization layer, an anode layer, the organic opening layer, a luminescent material layer, the cathode layer, and the encapsulation layer.

4. The organic light-emitting diode display panel according to claim 1, wherein a film layer structure of the transparent area comprises the substrate, the inorganic buffer layer, the active semiconductor layer, the inorganic insulating layer, the first-high light-transmissive metal wire, the second-high light-transmissive metal wire, the organic planarization layer, the organic opening layer, the cathode layer, and the encapsulation layer.

5. The organic light-emitting diode display panel according to claim 3, wherein the anode layer and the first-metal wire are electrically connected through a third via-hole.

6. The organic light-emitting diode display panel according to claim 3, wherein the first-metal wire and the active semiconductor layer are electrically connected through a fourth via-hole.

7. The organic light-emitting diode display panel according to claim 3, wherein the substrate is composed of polyimide.

8. The organic light-emitting diode display panel according to claim 3, wherein the organic planarization layer and the organic opening layer are composed of transparent organic materials.

9. An organic light-emitting diode display panel comprising:
   a display area for displaying images, a film layer structure of the display area comprises a substrate, an inorganic buffer layer, an active semiconductor layer, an inorganic insulating layer, a first-metal wire, a second-metal wire, a third-metal wire, an organic planarization layer, an anode layer, an organic opening layer, a luminescent material layer, a cathode layer, and an encapsulation layer;
   a transparent area for placing a device, a film layer structure of the transparent area comprises the substrate, the inorganic buffer layer, the active semiconductor layer, the inorganic insulating layer, a first-high light-transmissive metal wire, a second-high light-transmissive metal wire, the organic planarization layer, the organic opening layer, the cathode layer, and the encapsulation layer; and
   a wire exchange area, positioned at a wire connecting site between the display area and the transparent area, a film layer structure of the wire exchange area comprises the substrate, the inorganic buffer layer, the active semiconductor layer, the inorganic insulating layer, the first-metal wire, the first-high light-transmissive metal wire, the second-high light-transmissive metal wire, the third-metal wire, the organic planarization layer, the organic opening layer, the cathode layer, and the encapsulation layer;

wherein the first metal wire is electrically connected to the second-high light-transmissive metal wire through a first via hole, the third metal wire is electrically connected to the first-high light-transmissive metal wire through a second via hole, and the first-high light-transmissive metal wire and the second-high light-transmissive metal wire extend to the transparent area.

10. The organic light-emitting diode display panel according to claim 9, wherein the first high light-transmissive metal wire and the second-high light-transmissive metal wire are each composed of at least one of indium gallium zinc oxide (InGaZnO), indium gallium oxide (InGaO), indium tin zinc oxide (ITZO), and aluminum zinc oxide (AlZnO).

11. The organic light-emitting diode display panel according to claim 9, wherein the anode layer and the first-metal wire are electrically connected through a third via-hole at the display area.

12. The organic light-emitting diode display panel according to claim 9, wherein the first-metal wire and the active semiconductor layer are electrically connected through a fourth via-hole at the display area.

13. The organic light-emitting diode display panel according to claim 9, wherein the substrate is composed of polyimide.

14. The organic light-emitting diode display panel according to claim 9, wherein the organic planarization layer and the organic opening layer are composed of transparent organic materials.

15. An organic light-emitting diode display panel comprising:
   a display area for displaying images;
   a transparent area for placing a device; and
   a wire exchange area, positioned at a wire connecting site between the display area and the transparent area;
   the wire exchange area comprises a substrate, an inorganic buffer layer, an active semiconductor layer, a third-metal wire, an inorganic insulating layer, a first-high light-transmissive metal wire, a first-metal wire, an organic planarization layer, a second-high light-transmissive metal wire, an organic opening layer, a cathode layer, and an encapsulation layer which are stacked in sequence;
   the first metal wire is electrically connected to the second-high light-transmissive metal wire through a first via hole, the third metal wire is electrically connected to the first-high light-transmissive metal wire through a second via hole, and the first-high light-transmissive metal wire and the second-high light-transmissive metal wire extend to the transparent area;
   wherein the first high light-transmissive metal wire and the second-high light-transmissive metal wire are each composed of at least one of indium gallium zinc oxide (InGaZnO), indium gallium oxide (InGaO), indium tin zinc oxide (ITZO), and aluminum zinc oxide (AlZnO); and
   wherein a film layer structure of the display area comprises the substrate, the inorganic buffer layer, the active semiconductor layer, the inorganic insulating layer, the first-metal wire, a second-metal wire, the third-metal wire, the organic planarization layer, an anode layer, the organic opening layer, a luminescent material layer, the cathode layer, and the encapsulation layer.

* * * * *